United States Patent
Wang (10) Patent No.: US 7,467,150 B2
(45) Date of Patent: Dec. 16, 2008

(54) BLOCK-AWARE ENCODING OF BITMAP FOR BITMAP INDEX ELIMINATING MAX-SLOT RESTRICTION

(75) Inventor: Shaoyu Wang, Redwood City, CA (US)

(73) Assignee: Oracle International Corproation, Redwood Shores, CA (US)

( * ) Notice: Subject to any disclaimer, the term of this patent is extended or adjusted under 35 U.S.C. 154(b) by 318 days.

(21) Appl. No.: 11/259,456

(22) Filed: Oct. 25, 2005

(65) Prior Publication Data

US 2007/0094287 A1    Apr. 26, 2007

(51) Int. Cl.
*G06F 7/00* (2006.01)
*G06F 17/00* (2006.01)

(52) U.S. Cl. .......................... 707/101; 341/50; 341/51; 341/55; 341/92; 341/95; 707/3; 707/203; 708/210; 708/211; 708/212; 710/68

(58) Field of Classification Search ................ 341/50, 341/51, 55, 92, 95; 707/3, 101, 203; 708/210, 708/211, 212; 710/68
See application file for complete search history.

(56) References Cited

U.S. PATENT DOCUMENTS

| | | | | |
|---|---|---|---|---|
| 4,626,829 A | * | 12/1986 | Hauck | 341/63 |
| 5,363,098 A | | 11/1994 | Antoshenkov | |
| 5,884,307 A | * | 3/1999 | Depledge et al. | 707/7 |
| 5,903,888 A | * | 5/1999 | Cohen et al. | 707/3 |
| 5,924,088 A | * | 7/1999 | Jakobsson et al. | 707/2 |
| 6,205,442 B1 | * | 3/2001 | Cohen et al. | 707/2 |
| 6,405,187 B1 | | 6/2002 | Egan et al. | |

OTHER PUBLICATIONS

Bookstein et al., Models of Bitmap Generation: A Systematic Approach to Bitmap Compression, 1992, Information Processing & Management, pp. 1-20.*
Wu et al., A Performance Comparison of bitmap indexes, 2001, Association for Computing Machinery, pp. 1-3.*
Wu et al, On the Performance of Bitmap Indices for High Cardinality Attributes, Mar. 5, 2004, Lawrence Berkeley National Laboratory, pp. 1-17.*

(Continued)

*Primary Examiner*—Etienne P LeRoux
*Assistant Examiner*—Jorge A Casanova
(74) *Attorney, Agent, or Firm*—Hickman Palermo Truong & Becker LLP (57) ABSTRACT

Under block-aware encoding, a bitmap represented by atoms comprises a series of bitmaps for each data block in a database. Each bitmap in the series is referred to herein as a block bitmap. Each block bitmap may have a different number of bytes or bits. Gaps are represented in atoms using a pair of numbers referred to as a gap code. A gap code includes a block-skip code and slot-skip code. A block-skip code represents how many block bitmaps to advance to reach a subsequent block bitmap; a slot-skip code represents how many bytes to advance within the block bitmap to reach a byte with at least one bit set. A gap code is represented by bit positions within a byte, with some bit positions allocated to represent the block-skip code and some to represent the slot-skip code. The allocation is adjusted dynamically during encoding and decoding.

20 Claims, 5 Drawing Sheets

OTHER PUBLICATIONS

Koudas, Nick, Space Efficient Bitmap Indexing, 2000, ACM, pp. 1-8.*
Wu et al., Using Bitmap Index for Interactive Exploration of Large Datasets, 2003, IEEE, pp. 1-10.*
Moffat et al., Space-Efficient Construction Of Optimal Prefix Codes, 1995, IEEE, pp. 1-10.*
Wu et al., Compressing Bitmap Indexes for Faster Search Operations, 2002, IEEE, pp. 1-10.*
Wu et al., An Efficient Compression Scheme For Bitmap Indices, Apr. 13, 2004, Lawrence Berkeley National Laboratory, pp. 1-27.*
Antoshenkov, Gennady, Byte-Aligned Bitmap Compression, 1995, IEEE, p. 1.*
Pinar et al., Compressing Bitmap Indices by Data Reorganization, 2005, pp. 1-12.*
Buchmann et al., Encoded Bitmap Indexing for Data Warehouses, Feb. 23-27, 1998, DVS1, pp. 1-11.*
Wu et al., Compressed bitmap indices for efficient query processing, date: unknown, Lawrence Berkeley National Laboratory, pp. 1-16.*
IBM Corporation, "IBM eServer iSeries Support: Software Technical Document: 13511033 [online]". Retrieved on Jan. 27, 2006. Retrieved from the Internet: http://www-912.ibm.com/s_dir/slkbase.NSF/lac66549a2140218862..., 2 pages.
IBM Corporation, "DB2 UDB for iSeries Database Performance and Query Optimization V5R2, Bitmap processing method [online]". Retrieved on Jan. 27, 2006. Retrieved from the Internet: http://publib.boulder.ibm.com/iseries/v5r2/ic2924/info/rzajq/rzajpm..., pp. 1-5.
IBM Corporation, "DB2 UDB for iSeries Database Performance and Query Optimization V5R2, What are encoded vector indexes?[online]". Retrieved on Jan. 27, 2006. Retrieved from the Internet: http://publib.boulder.ibm.com/iseries/v5r2/info/rzajq/rzajqm..., pp. 1-5.
Chee-Yong Chan et al., "Bitmap Index Design and Evaluation," pp. 1-12. Date: Unknown.
IBM Corporation, Michael W. Cain, "Indexing and Statistics Strategies for DB2 UDB for iSeries, Version 3.0," Updated Nov. 2003, 63 pages.
Oracle Press Release, "Oracle 7 Release 7.3 Extends Oracles's Lead in Data Warehousing Market", Apr. 30, 1998, 3 pages.
Oracle Press Release, "Oracle to Host First Developer Conference: Preview New Products", May 6, 1998, DBMS, vol. 8, No. 13, 4 pages.
Martin Rennhackkamp, "DBMS Server Comparison Supplement Server Review Evaluation", Oracle 7 7.3 and Universal Server, DBMS vol. 9, No. 12, Nov. 1996, 5 pages.
Broadbase Information Systems, Inc. letter to Peter C. Mei, Oracle Corporation, Jul. 9, 1997, 2 pages.
U.S. Appl. No. 08/808,560, Rule 1.132 Declaration from Hakan Jakobsson, filed Sep. 17, 1998, 3 pages.
U.S. Appl. No. 08/808,560, Office Action Summary mailed May 13, 1998, 4 pages.

* cited by examiner

GAP ≅ 10 BLOCKS

BLOCK - AWARE ENCODING

INITIAL CONTROL BYTE
ALLOCATION = (2,3)
GAP BYTE BIT ALLOCATION = (4,3)

BLOCK-AWARE ENCODING OF BITMAP FOR BITMAP INDEX ELIMINATING MAX-SLOT RESTRICTION

RELATED APPLICATION

This application is related to U.S. patent Ser. No. 08/808,560, entitled Bitmap Index Compression, filed by Jeffrey I. Cohen, et al. on Feb. 28, 1997, now issued as U.S. Pat. No. 5,907,297 on May 25, 1999, the contents of which are herein incorporated by reference as if originally set forth herein and referred to herein as Cohen.

FIELD OF THE INVENTION

The present invention relates to compressing data in computer systems, and more particularly, to the compression of bitmaps within bitmap indexes used to access data stored in databases.

BACKGROUND OF THE INVENTION

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

A bitmap index is an index that includes a set of bitmaps that can be used to efficiently process queries on a body of data associated with the bitmap index. In the context of bitmap indexes, a bitmap is a series of bits that indicate which of the records stored in the body of data satisfy a particular criterion. Each record in the body of data has a corresponding bit in the bitmap. Each bit in the bitmap serves as a flag to indicate whether the record that corresponds to the bit satisfies the criterion associated with the bitmap.

Typically, the criterion associated with a bitmap is whether the corresponding records contain a particular key value. In the bitmap for a given key value, all records that contain the key value have their corresponding bits set to 1 while all other bits are set to 0. A collection of bitmaps for the key values that occur in the data records can be used to index the data records. In order to retrieve the data records with a given key value, the bitmap for that key value is retrieved from the index, and for each bit set to 1 in the bitmap, the corresponding data record is retrieved.

When a bit in a bitmap of a key value is referred to as being set, the bit is set to a value that specifies that the corresponding row satisfies one or more criteria (e.g. has the key value). When the bit is referred as being unset, the bit is set to a value that specifies that the corresponding row does not contain the key value. For purposes of exposition, a bit is set to 1 and unset to 0. However, the present invention is not so limited.

Since bitmaps are in the form of binary numbers, they can be combined in logical operations (e.g. AND operations) very efficiently in a digital computer. However, bitmaps waste space when a large portion of each bitmap is used to store nothing but logical zeros. For example, assume that a table contains a million rows, where a particular column of the table has 500,000 distinct values. A bitmap index on that column would have 500,000 index entries storing bitmaps which, on average, have two bits set to "1" and 999,998 bits set to "0".

To further enhance the efficiency of bitmaps, bitmap compression is used. There are various compression techniques, some of which are designed for bitmap indexes in large databases. One approach for such compression is gap encoding. In general, gap encoding is based on using a set of one or more bytes, referred to as atoms, to represent both bytes with bits set and a series of bytes with no bit sets that sit between the bytes with bits set.

Specifically, an atom is used to represent one or more bytes with no bits set and a contiguous series of at least one byte with at least one bit set. The one or more bytes with no bits set are referred to herein as a gap. The number of bytes in the gap is referred to as the gap size. The contiguous series includes either an offset byte, which has one bit set, or a mini-map, which is a series of one or more bytes at least one of which having more than one bit set. The number of bytes in the mini-map is referred to herein as the mini-map size. Thus, an atom represents a gap followed by either an offset byte or a mini-map.

Cohen describes a byte gap compression approach that uses four types of atoms. Each type includes a control byte, and, depending on the type of the atom, a mini-map or one or more gap size bytes.

The control byte includes five bits that represent an atom type field. The value in the atom type field identifies the atom's type. The other three bits form either a mini-map size field, which represents a mini-map size (i.e. number of bytes in a mini-map), or an offset bit field, which represents which bit is set in an offset byte.

The atom type field in the control byte is also used to store gap size information for short gaps. If gap size exceeds the limit that the control byte can represent for a particular type of atom, then one or more additional gap size bytes are used to represent the gap size. A larger gap requires more than one gap size byte to represent the value of the gap's gap size. Thus, an atom may include multiple gap size bytes to represent a larger gap.

The following Table O lists each atom type, the make up of the atom type, and value ranges for the atom type field.

TABLE O

| ATOM TYPE | ATOM TYPE FIELD | OFFSET FIELD | MINI-MAP SIZE FIELD | REPRESENTS |
| --- | --- | --- | --- | --- |
| short gap bit | 0-23 | 0-7 | — | offset byte + gap 0-23 |
| long gap bit | 24 | 0-7 | — | offset byte + gap size >23 |
| short gap map | 25-30 | — | 0-7 | mini-map = 1-8 + gap size = 0-5 |
| long gap map | 31 | — | 0-7 | mini-map = 1-8 + gap size >5 |

In the atom type field, the range 0-23 is used to indicate both that an atom is a short gap bit atom and to specify a gap size. The range 25-30 is used to indicate both that an atom is a short gap map atom and to specify a gap size. The long gap bit atom and long gap map atoms include one or more gap-size bytes to specify a gap size.

The bitmap that a series of atoms is presumed to represent is referred to herein as the conceptual bitmap. In Cohen, a bit in the conceptual bitmap is mapped to a row-id by a mapping function based on the data block that holds the row-id. A row-id includes a relative block number of the row's data block and the row's slot. The relative data block number is the ordinal position of a data block among the data blocks that hold the rows of a table. The row's slot is its ordinal position relative to the other rows stored in the data block.

A data block is an atomic unit of persistent storage of rows. When a database system performs input/output operations to read rows, it reads units of rows no smaller than a data block and stores them in a buffer. Data block sizes may vary within a particular database system.

A bit in a bitmap maps to a particular slot in a data block. A fundamental assumption made to use the mapping function, and thus a fundamental principle of operation of Cohen, is that each data block has an equal number of slots. To ensure that there is slot, and hence a corresponding bit in a bitmap, for every row that could be possibly stored in a data block, the data blocks are assumed to have the same number of slots. This number is referred to herein as the max-slot factor.

The mapping functions of Cohen are based on the max-slot factor. For simplicity the max-slot factor is rounded to the nearest multiple of 8 that is greater. The mapping function of Cohen that maps a row to a byte in the bitmap is as follows:

relative-block number * max-slot factor/8+slot #/8

The relative-block number is an integer representing the relative ordinal position of the row's data block, as specified by the row's row-id. The slot # is the slot number of the row. The mapping function generates one linear number that identifies a byte's ordinal position within the conceptual bitmap. Thus, in Cohen, the conceptual bitmap is treated as a linear stream of bytes that is mapped to a slot or row by a single linear number.

Data blocks most often contain less than the max-slot factor number of rows. Consequently, a gap represented by an atom maps to row-ids of rows that do not exist. In effect, the portion of the conceptual bitmap that corresponds to a data block is padded with unset bits for rows that do not exist. The number of atoms and space required for the bitmap index is thus inflated.

Ostensibly, to place a bound on the number and size of atoms needed to represent a bitmap for a bitmap index, the minimum size of a row is calculated, and from this calculation, the maximum number of rows that can be stored in a data block is determined. This number is treated as the max-slot number. Thus, if a data block is 32 k, and minimum row size is 32, than at most a data block can hold 1 k of rows.

However, with table compression and row deletion, a data block can actually have more rows than the minimum row size indicates. For example, in a data block, a deleted row that occupies a slot can be represented by one or more bytes allocated for the row's header but with no bytes allocated for the row's columns. To account for table compression and row deletion, the maximum number of rows determination based on minimum row size is multiplied by a factor as high as, for example, 10, which further exacerbates the inflation of atom size and quantity that results from the max-slot factor assumption.

To reduce such inflation, a database system may restrict the number of rows that a data block may have, thereby imposing a bound on the max-slot factor. However, the restriction limits the amount of compression that could be achieved from table compression.

Based on the foregoing, there is clearly a need to reduce or eliminate the inflation of atom quantity and size caused by the max-slot factor assumption and to eliminate the need to impose a max-slot factor restriction in a database system.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

A method and apparatus for compressing bitmaps is described. In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

Described herein is an approach to gap encoding that is referred to herein as block-aware encoding. Under block-aware encoding, the conceptual bitmap is not comprised of one bitmap for a set of data blocks. Rather, the conceptual bitmap consists of a series of bitmaps for each data block. Each bitmap in the series is referred to herein a block bitmap. Each block bitmap may have a different number of bytes or bits. A block bitmap does not have to be padded with gaps for rows that do not exist.

Gaps are represented in atoms using a pair of numbers referred to as a gap-code. A gap code includes a block-skip code and slot-skip code. The block-skip code represents how many block bitmaps to advance to reach the block bitmap with the next offset byte or mini-map; a slot-skip code represents how many bytes to skip within the block bitmap to reach the next offset byte or mini-map.

Figure 1:
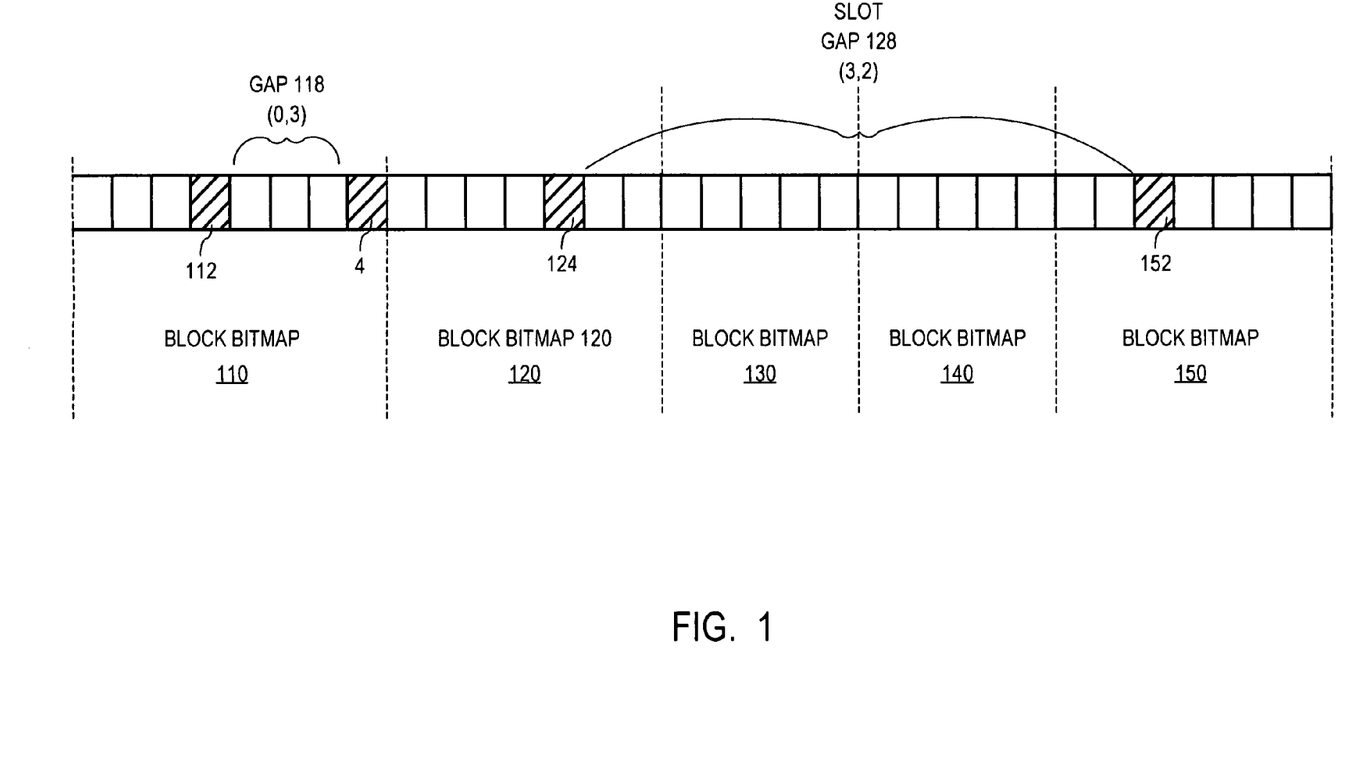
FIG. 1 is a block diagram depicting a bitmap with gaps according to an embodiment of the present invention.

FIG. 1 is a block bitmap diagram used to illustrate various gap-sizes, gap sizes, and gap codes. Referring to FIG. 1, it shows conceptual bitmap 101, which includes block bitmaps 110, 120, 130, 140, and 150. Block bitmap 110 includes 8 bytes, block bitmap 120 includes 7 bytes, block bitmap 130 includes 5 bytes, block bitmap 140 includes 5 bytes, and block bitmap 150 includes 7 bytes. Block bitmap 110 includes offset byte 112, block bitmap 120 includes offset byte 124, and block bitmap 150 includes offset byte 152. Block bitmaps 130 and 140 contain no bytes with at least one bit set; hence block bitmaps 130 and 140 are referred to herein as gap bitmaps.

Various gaps are shown within bitmap 101. These include gap 118, within block bitmap 110, and gap 128, which spans block bitmaps 120, 130, 140, and 150. The block-skip code and slot-skip code of gap 118 is 0 and 3, respectively. The gap code of a gap is represented by the following notation: (block-skip code #, slot-skip code #). Thus, the gap code of gap 118 is (0,3). The gap code of gap 128 is (3,2).

A block-skip code may be zero, representing that no block need to be advanced to. A slot-skip code may be zero, representing that no bytes need to be advanced to. A gap code can be (0,0), for example, for atoms that represent contiguous mini-maps with no interstitial gaps.

Mapping Function Simpler

Under block-aware encoding, the mapping function that maps a row or slot to a byte in the conceptual bitmap can involve simpler arithmetic as compared to the mapping function of Cohen. In Cohen, one number generated by a mapping function maps a row to a corresponding byte in the conceptual bitmap. The computation of the mapping function and its inverse requires multiplication or division operations. In block-aware encoding, on the other hand, a pair of numbers maps a row to its corresponding byte in the conceptual bitmap. The first number is the ordinal position of the block bitmap corresponding to the row, which is simply the ordinal position of the corresponding data block. Thus, the relative data block number in a row-id, which identifies the ordinal position of the row's data block, also identifies the ordinal position of the row's corresponding block bitmap in the conceptual bitmap. One can use (slot#/8) to determine the row's respective byte within the block bitmap. Thus, as compared to the mapping function of Cohen, no multiplication or division arithmetic is required to generate the pair of numbers needed to map a row to a corresponding byte in the conceptual bitmap. The reduced need for multiplication and division operations during the conversion between row-id's and byte positions in the conceptual bitmap can benefit the performance of encoding and decoding atoms.

Gap Codes Represented by Bit Allocation

Bit allocation is used to represent a gap code. Under bit allocation, some bit positions of a byte and/or field are used to represent one number and other bit positions in the byte or field are used to represent another number. Bit allocation allows a pair of numbers (or more) to be represented by one byte or field, rather than to be represented by separate bytes or fields. Under bit allocation for the gap code, some bit positions are allocated to representing the block-skip code and some are allocated to representing the slot-skip code. A particular bit allocation is represented by the following notation (block-skip code allocation #, slot-skip allocation #). For example, (5,2) represents that 5 bit positions are allocated to the block-skip code and 2 bit positions are allocated to the slot-skip code.

Atom Types and Structure

According to an embodiment of the present invention, block-aware encoding uses four types of atoms. Each type includes a control byte, and, depending on the type of atom, a mini-map or one or more gap-code bytes.

The atom type byte includes five bits that represent the type of atom and may represent a gap code for types of atoms, the gap code being represented via bit allocation. The value in the atom type field identifies the atom's type. The other three bits form either a mini-map size field or an offset bit field. When the atom type field cannot be used to represent the gap code of an atom, one or more gap-code bytes may be included in the atom to represent the gap code. The following Table O lists each atom type, the make up of the atom type, and value ranges for the atom type field.

TABLE O

| ATOM TYPE | ATOM TYPE FIELD | OFFSET FIELD | MINI-MAP SIZE FIELD | REPRESENTS |
|---|---|---|---|---|
| short gap bit | 0-(s − 1) | 0-7 | — | offset byte + gap code of 0-(s − 1) |
| short gap map | s − 28 | — | 0-7 | mini-map = 1-8 + gap code = 0-(28 − s) |

TABLE O-continued

| ATOM TYPE | ATOM TYPE FIELD | OFFSET FIELD | MINI-MAP SIZE FIELD | REPRESENTS |
|---|---|---|---|---|
| long gap map | 30 | — | 0-7 | mini-map = 1-8; gap code represented by gap-code bytes |
| long gap bit | 29 | 0-7 | — | offset byte; gap code represented by gap-code bytes |

Short gap bit atoms represent a gap and an offset byte. Short gap bit atoms have only one byte, a control byte. The atom field represents both the atom's type and the gap code using bit allocation. A short gap bit atom also includes an offset byte field to represent an offset byte.

Short gap map atoms represent a gap plus a mini-map. A short gap map atom includes a control byte plus one or more bytes representing the mini-map. Like the short gap bit atom, the atom type field is used to represent a gap code. However, in lieu of an offset byte field, the short gap map atom includes a mini-map size field to represent the size of a mini-map.

Short gap bit atoms and short gap map atoms are referred to herein as short gap atoms. Short gap atoms do not include gap-code bytes to represent a gap code. Rather, the atom type field is used to represent a gap code. The value range of s to 28 is used identify an atom as a short gap map atom, while the range of 0 to s−1 identifies a short gap bit atom. The variable s is referred to as the type separation point.

Long gap bit atoms and long gap map atoms are referred to herein as long gap atoms. Long gap atoms include gap-code bytes to represent a gap code. In the atom type field, a value of 29 identifies an atom as a long gap bit atom; a value of 30 identifies an atom as a long gap map atom.

Note that in this embodiment, the value 31 is not used to represent a particular type of atom, for the purpose of future extension of the encoding format. In another embodiment, value 31 may be used for one of the four types of atoms thus enabling one more short gap to be encoded within a control byte.

Bit Allocation for Gap Code

Figure 2:
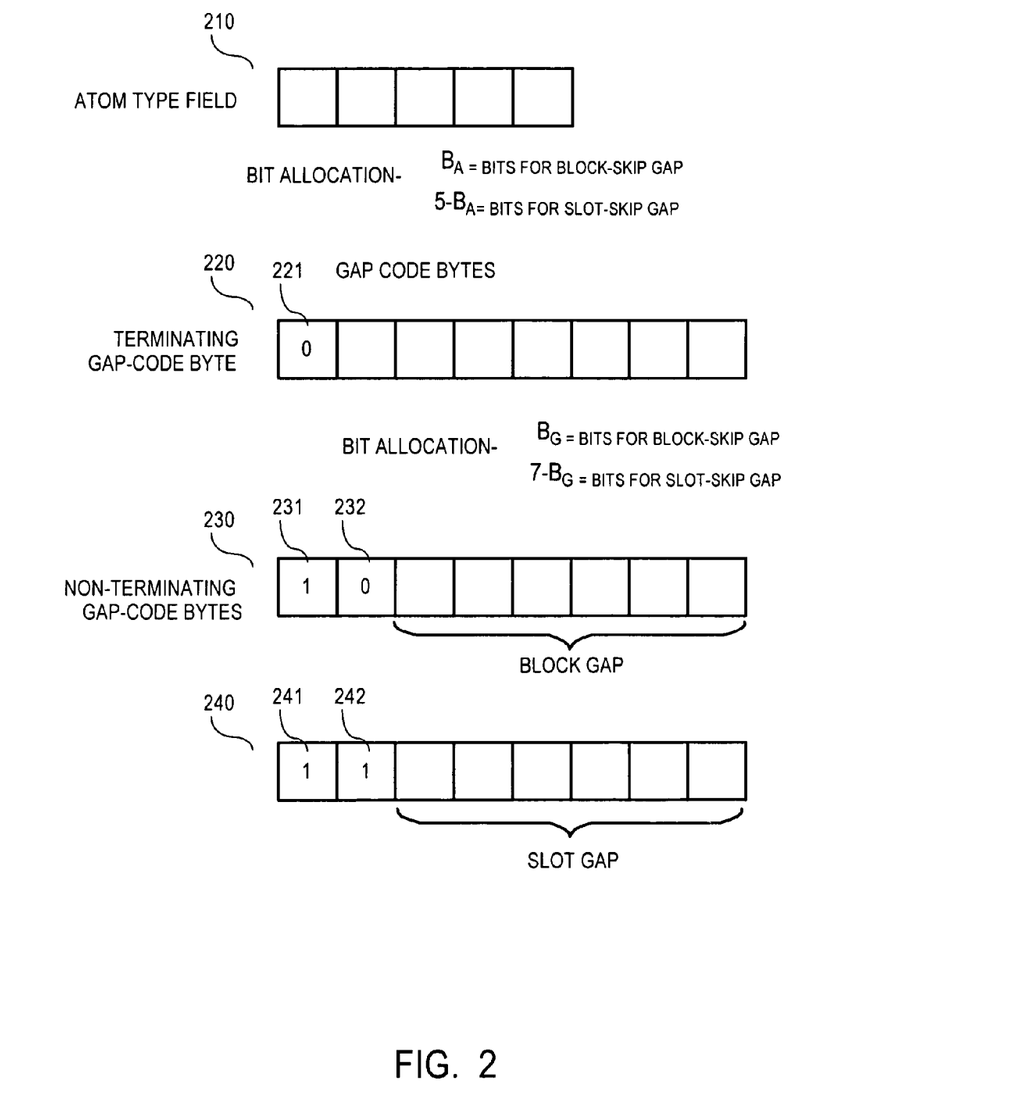
FIG. 2 is a block diagram depicting a byte of an atom that is a compressed representation of a bitmap.

Gap codes are represented using bit allocation in the atom type field and/or the gap code field. FIG. 2 is a block diagram showing the bits of the atom type field and of gap-code bytes according to an embodiment of the present invention.

Referring to FIG. 2, it shows illustrative atom type field 210. Within atom type field 210, $B_A$ bit positions are allocated to represent a block-skip code and $5-B_A$ bit positions are allocated to represent the slot-skip code. Allocation may be optimally varied according to the distribution of offset bytes and mini-maps within a conceptual bitmap.

FIG. 2 also shows several gap-code bytes that illustrate several types of gap-code bytes according to an embodiment of the present invention. An atom may contain a series of one or more gap-code bytes. The series includes zero or more non-terminating gap-code bytes followed by a terminating gap-code byte. The terminating gap-code byte terminates the series of gap-code bytes in an atom. In a gap code byte, a bit position, referred to as the terminating-flag, identifies whether a gap-code byte is a terminating or a non-terminating gap-code byte.

For example, the high bit position may be used as the terminating-flag. Terminating gap-code byte 220 has high bit 221 set to 0 to identify it as a terminating gap-code byte. High bit 231 of non-terminating gap-code byte 230 and high bit 241 of non-terminating gap-code byte 240 are both set to 1 to signify that the gap-code bytes are non-terminating.

In a terminating gap-code byte, the remaining bit positions not serving as the terminating-flag hold the gap code, which is represented using bit allocation. For example, terminating gap-code byte 220 has $B_G$ bit positions used for the block-skip code and 7-$B_G$ bit positions used for holding the slot-skip code.

However, a non-terminating gap-code byte does not use bit allocation to represent a gap code. Rather, a non-terminating gap-code byte holds a block-skip code or slot-skip code. A bit position in a non-terminating gap-code byte signifies whether the gap-code byte holds a block-skip code or a slot-skip code. For example, in non-terminating gap-code bytes 230 and 240, the second-high bit position indicates whether the non-terminating gap-code byte holds a block-skip code or slot-skip code. Specifically, in gap-code byte 230, the value 0 in second-high bit position 232 indicates that gap-code byte 230 holds a block-skip code. In gap-code byte 240, the value 1 in the second-high bit position 242 indicates that gap-code byte 240 holds a slot-skip code.

The bit positions that represent a value of a block-skip code or slot-skip code may be in more than one byte. For example, bit positions in both a terminating and non-terminating gap-code byte can be used to store all the bits that represent a block-skip code. A set of bit positions, a field, or a byte are referred to as holding a value if the set of bit positions, field, or byte stores all or some of the bits that represent that value.

Dynamic Bit Allocation

While encoding atoms for a bit map, bit allocation for the gap code can be adjusted to attempt to optimize compression, i.e. use less bytes to represent the same conceptual bitmap. In general, after encoding an atom, one or more "bit allocation criteria" are evaluated to determine whether to adjust the bit allocation for the atom type field or for the terminating gap-code bytes. Bit allocation criterion is a standard, rule, or test that is used to determine whether to adjust bit allocation to attempt to optimize compression. For example, after encoding an atom, a terminating and non-terminating gap-code byte are used to represent the block-skip code. An evaluation is made to determine whether allocating one or more bit positions in the terminating gap-code byte might allow a bigger block-skip code to be represented in just the terminating gap-code byte. If so, then one bit position is allocated to the block-skip code and one position is de-allocated for slot-skip code.

Figure 3:
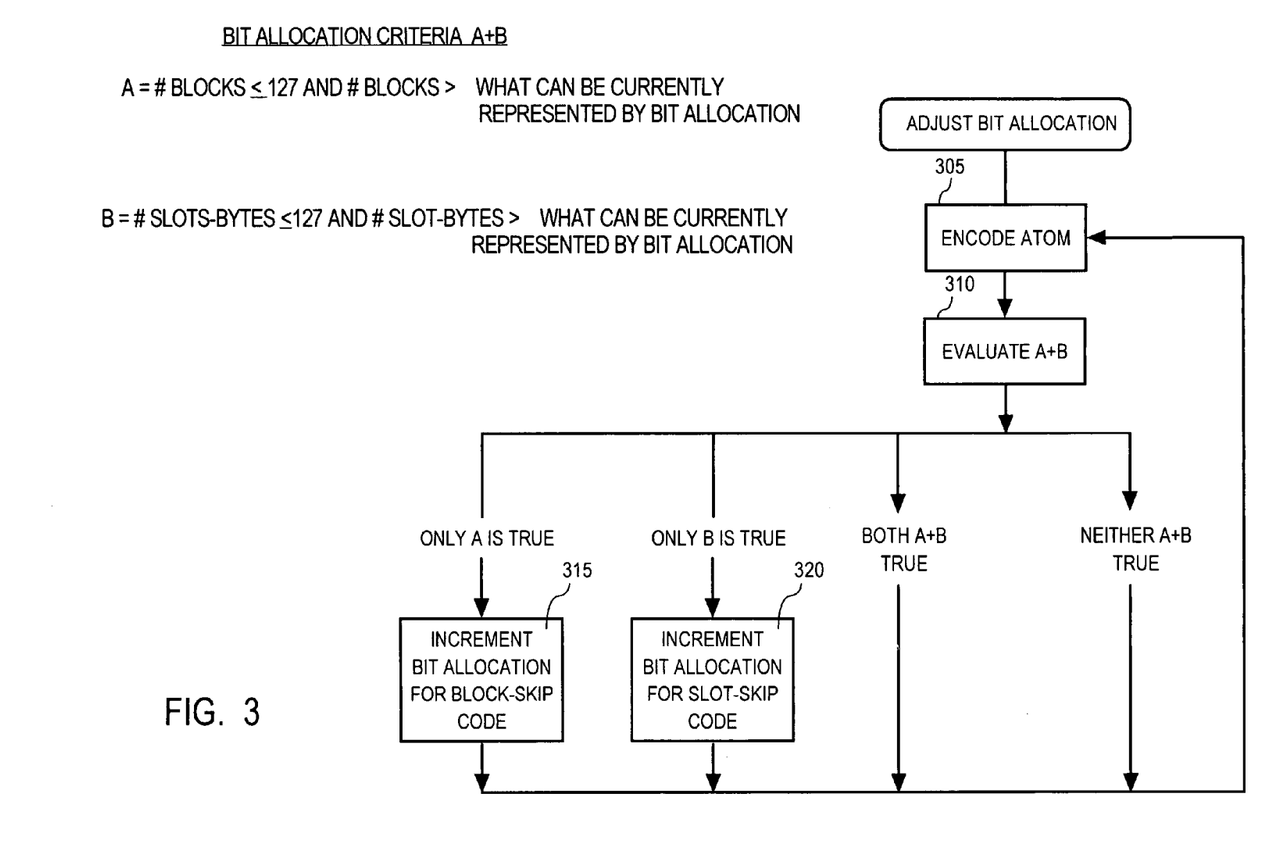
FIG. 3 is a flow chart depicting a process for encoding atoms that dynamically adjust the allocation of bit positions used to represent various kinds of gap codes according to an embodiment of the present invention.

FIG. 3 is a flow chart of a procedure used to adjust bit allocation during atom encoding for a terminating gap-code byte, according to an embodiment of the present invention. The procedure uses bit allocation criterion A and bit allocation criterion B to dynamically adjust the bit allocation for terminating gap-code bytes. The criterion is evaluated after encoding an atom, referred to hereafter as the current atom. If the procedure encounters a case where it could have used one less gap-code byte to represent the gap code, the procedure adjusts the bit allocation accordingly. It is assumed that the case just encountered is the most likely to be subsequently encountered, and that the compression is optimized by optimizing for the case that will most likely be subsequently encountered. The block-skip code of the current atom is # blocks; the slot-skip code of the current atom is # slot-bytes.

Criterion A is true if:
blocks is less or equal to 127 and is greater than what the block-skip code can be represented under the current bit allocation.

Criterion B is true if:
slot-bytes is less than or equal to 127 and is greater than what the slot-skip code can be represented under the current bit allocation.

Criterion A is used to determine whether increasing the bit allocation within a terminating gap-code byte for the block-skip code could allow the "current block-skip code" of the current atom to be represented by only the terminating gap-code byte, thereby eliminating the need for a non-terminating gap-code byte. Criterion A can only be true if two conditions are met. As for the first condition, the current block-skip code of the terminating gap-code byte is too big to be represented by the "current bit allocation" of the terminating gap-code byte of the current atom. Increasing the bit allocation for current block-skip code might allow the block-skip code to be represented by just a terminating gap-code byte. However, the largest number that can be represented under any bit allocation for the terminating gap-code byte is 127. Hence, the second condition is that the current block-skip code be less than or equal to 127. If the current block-skip code were greater than 127, then a non-terminating gap-code byte is required any way to represent the current block-skip code.

For example, for the current atom, the current bit allocation is (4,3). The largest block-skip code that can be represented by 4 bit positions is 15; the largest slot-skip code that can be represented is 7. The block-skip code and slot-skip code for the current atom is 16 and 2. Thus, A is TRUE.

Criterion B is a criterion that is used to determine whether increasing the bit allocation of the terminating gap-code byte for the slot-skip code would have allowed the "current slot-skip code" of the current atom to be represented by only the terminating gap-code byte, thereby eliminating the need for a non-terminating gap-code byte. Criterion B can only be true if two conditions are met. The first condition is that the current slot-skip code of the current atom is too big to be represented by the "current bit allocation" of the terminating gap-code byte of the current atom. Increasing the bit allocation for current slot-skip code might allow it to be represented by only a terminating gap-code byte. The second condition is that the current slot-skip code be less than or equal to 127.

Referring to FIG. 3, at step 305, an atom is encoded. At step 310, the bit allocation criteria A and B are evaluated.

If only A is TRUE, then at step 315, the bit allocation for the block-skip code is incremented by 1, that is, one more bit position is allocated to represent the block-skip code, one less is allocated to represent the slot-skip code. Thus, if the current bit allocation is (4,3), it is adjusted to (5,2). Then, at step 305, the next atom is encoded based on the newly adjusted bit allocation.

In an embodiment of the present invention, it is possible to use a more accurate heuristic to determine whether to adjust bit allocation or not. For example, one can try a different bit allocation for the gap bytes and replay the encoding of the current atom, to see if the new bit allocation can use a less number of bytes for the gap bytes. Although such techniques can potentially improve the compression ratio, it requires more complicated logic to execute during encoding/decoding than the previous criteria used. Using simple heuristics such as criteria A and B to adjust bit allocation requires logic that can be executed more quickly during encoding/decoding.

If only B is TRUE, then at step 320, the bit allocation for the slot-skip code is incremented by 1, and then the next atom is encoded based on the newly adjusted bit allocation. If A and B are both TRUE or FALSE, no adjustment to the bit allocation is made.

Criteria A and B are examples of bit allocation criteria that can be used in an embodiment of the present invention. An embodiment of the present invention can include other bit allocation criteria. Therefore, it is understood that an embodiment of the present invention is not limited to any type of bit allocation criteria.

When decoding atoms, the bit allocation should be dynamically adjusted by applying the same bit allocation criteria in the same way. This ensures that the bit allocation under which an atom was encoded is also used to decode it.

ILLUSTRATIVE COMPRESSION EXAMPLE

Figure 4:
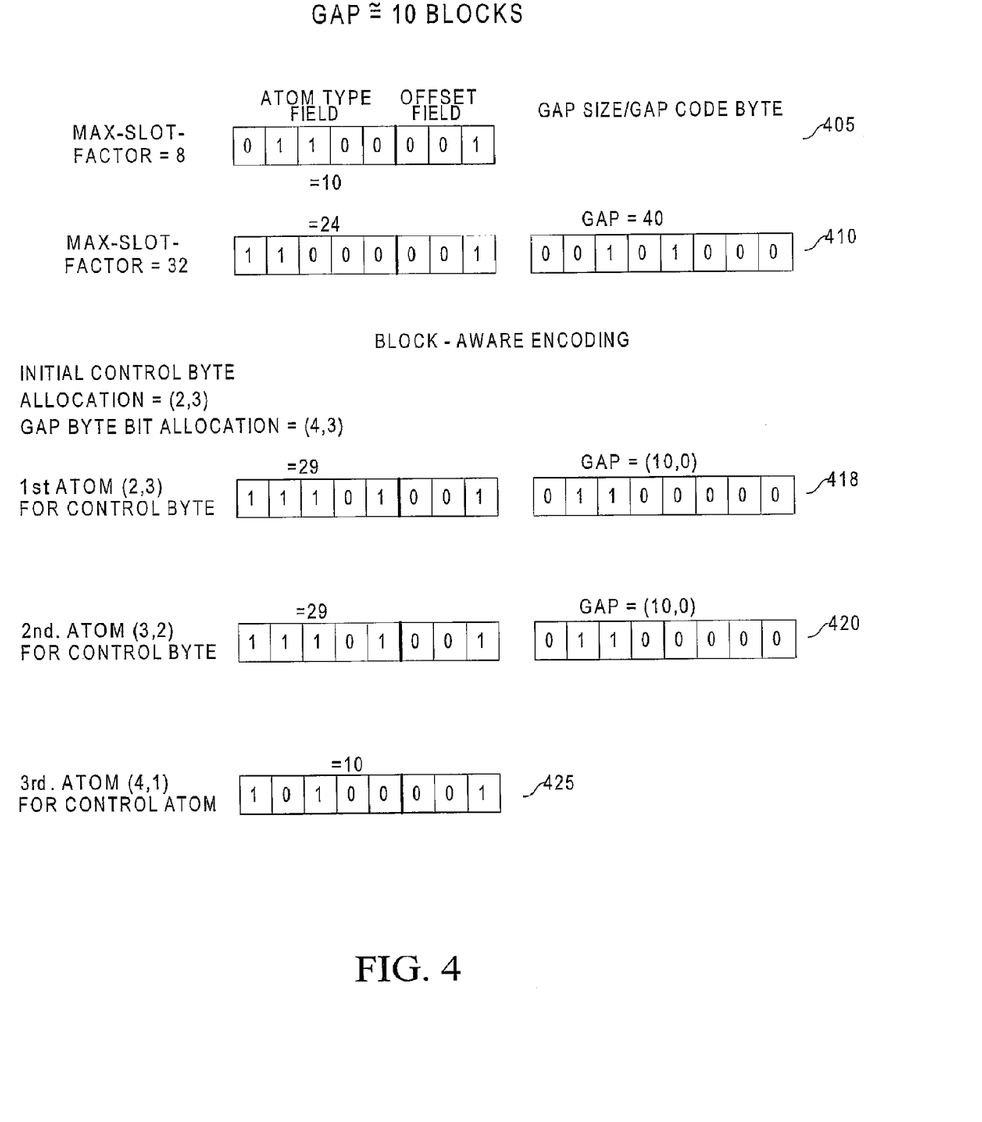
FIG. 4 is a flow chart depicting atoms used to illustrate encoding according to an embodiment of the present invention.

FIG. 4 is a diagram that shows atoms used to illustrate an embodiment of the present invention. For purposes of comparison, FIG. 4 depicts atoms compressed using a compression scheme of Cohen and atoms compressed using block-aware encoding according to an embodiment of the present invention. For purposes of illustration, the conceptual bitmap has gaps between offset bytes, where the gaps correspond to 10 data blocks.

Referring to FIG. 4, atoms 405 and 410 represent atoms generated under different max-slot factors. Atom 405 is generated for a max-slot factor of 8. The atom type of field is set to 10, to indicate that atom 405 represents a short gap bit atom with a gap of 10 bytes.

Atom 410 is generated for a max-slot factor of 32. The atom type field is set to 24, to indicate that atom 410 represents a long gap bit atom with one or more gap size bytes. Atom 410 includes one gap size byte, representing a gap of 40 bytes.

Atoms 418-425 represent successive atoms generated by block-aware encoding and dynamic bit allocation. The initial bit allocation is (2,3) for the atom type field.

Atom 418 is generated with a bit allocation of (2,3) for the atom type field. The atom type field is set to 29 identifying atom 418 as a long gap bit atom. The non-terminating gap-code byte of atom 405 specifies a block-skip code of 10.

After dynamic bit allocation adjustment, the bit allocation for the atom type field is (3,2). Nevertheless, this bit allocation is not sufficient to represent a block-skip code of 10. Therefore, the next atom generated, atom 420, is also a long gap bit atom, with an atom type field set to 29 and non-terminating gap-code byte that specifies a block-skip code of 10.

After dynamic bit allocation adjustment, the bit allocation for the atom type field is (4,1). This bit allocation is sufficient to represent a block-skip code of 10. Therefore, the next atom generated, atom 425, is also a short gap bit atom, with an atom type field set to 10, identifying that atom 425 is a short gap bit atom and representing a block-skip code of 10.

Short Gap Adjustments for Short Gap Atoms

Because the atom type field is also used as a gap code, after applying bit allocation a range of values is used to represent staying within the same block, i.e. a block-skip code of 0. However, the representation capability of the control byte is different between this block and the next block, depending on the stopping slot-byte of the preceding atom. For example, if the preceding atom stops at slot-byte #5, then with a (2,3) short gap bit allocation, the short gap can represent slot-byte 6 through 13 in this block, and slot-byte 0 through 7 in the next block. This is actually a wasted representation capability for short gaps. When the short gap allocation is stabilized around (2,3), it is likely to mean that slot byte #>7 is less probable. Thus, using short gap 0 through 7 to represent slot byte #6 through 13 in the same block is somewhat wasteful, as this range can be used to represent slot bytes in subsequent blocks instead.

To avoid this wastage, a simple short gap adjustment technique is used: (1+last slot-byte number of preceding atom) is added to short gap code before interpreting it. In the previous example, 5 is added to the short gap code 7 to obtain the adjusted short gap code 12, which then represents a gap (1,4) under (2,3) bit allocation. In this scheme, short gap would only represent up to slot-byte 7 in both this block and the next block.

Hardware Overview

Figure 5:
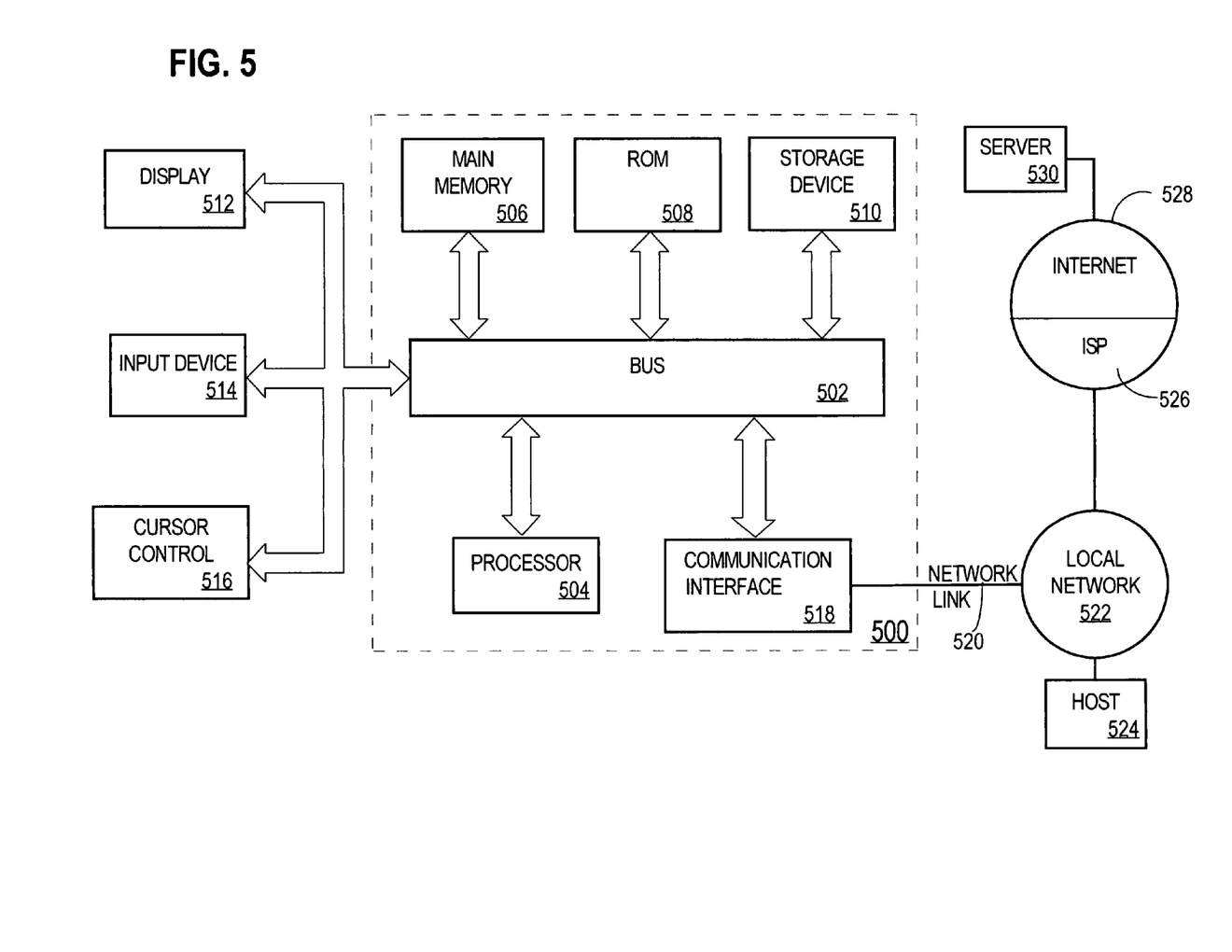
FIG. 5 is a block diagram depicting a computer system that may be used to implement an embodiment of the present invention.

FIG. 5 is a block diagram that illustrates a computer system 500 upon which an embodiment of the invention may be implemented. Computer system 500 includes a bus 502 or other communication mechanism for communicating information, and a processor 504 coupled with bus 502 for processing information. Computer system 500 also includes a main memory 506, such as a random access memory (RAM) or other dynamic storage device, coupled to bus 502 for storing information and instructions to be executed by processor 504. Main memory 506 also may be used for storing temporary variables or other intermediate information during execution of instructions to be executed by processor 504. Computer system 500 further includes a read only memory (ROM) 508 or other static storage device coupled to bus 502 for storing static information and instructions for processor 504. A storage device 510, such as a magnetic disk or optical disk, is provided and coupled to bus 502 for storing information and instructions.

Computer system 500 may be coupled via bus 502 to a display 512, such as a cathode ray tube (CRT), for displaying information to a computer user. An input device 514, including alphanumeric and other keys, is coupled to bus 502 for communicating information and command selections to processor 504. Another type of user input device is cursor control 516, such as a mouse, a trackball, or cursor direction keys for communicating direction information and command selections to processor 504 and for controlling cursor movement on display 512. This input device typically has two degrees of freedom in two axes, a first axis (e.g., x) and a second axis (e.g., y), that allows the device to specify positions in a plane.

The invention is related to the use of computer system 500 for implementing the techniques described herein. According to one embodiment of the invention, those techniques are performed by computer system 500 in response to processor 504 executing one or more sequences of one or more instructions contained in main memory 506. Such instructions may be read into main memory 506 from another computer-readable medium, such as storage device 510. Execution of the sequences of instructions contained in main memory 506 causes processor 504 to perform the process steps described herein. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 504 for execution. Such a medium may take many forms, including but not limited to, non-volatile media, volatile media, and transmission media. Non-volatile media includes, for example, optical or magnetic disks, such as storage device 510. Volatile media includes dynamic memory, such as main memory 506. Transmission media includes coaxial cables, copper wire and fiber optics, including the wires that comprise bus 502. Transmission media can also take the form of acoustic or light waves, such as those generated during radio-wave and infra-red data communications.

Common forms of computer-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 504 for execution. For example, the instructions may initially be carried on a magnetic disk of a remote computer. The remote computer can load the instructions into its dynamic memory and send the instructions over a telephone line using a modem. A modem local to computer system 500 can receive the data on the telephone line and use an infra-red transmitter to convert the data to an infra-red signal. An infra-red detector can receive the data carried in the infra-red signal and appropriate circuitry can place the data on bus 502. Bus 502 carries the data to main memory 506, from which processor 504 retrieves and executes the instructions. The instructions received by main memory 506 may optionally be stored on storage device 510 either before or after execution by processor 504.

Computer system 500 also includes a communication interface 518 coupled to bus 502. Communication interface 518 provides a two-way data communication coupling to a network link 520 that is connected to a local network 522. For example, communication interface 518 may be an integrated services digital network (ISDN) card or a modem to provide a data communication connection to a corresponding type of telephone line. As another example, communication interface 518 may be a local area network (LAN) card to provide a data communication connection to a compatible LAN. Wireless links may also be implemented. In any such implementation, communication interface 518 sends and receives electrical, electromagnetic or optical signals that carry digital data streams representing various types of information.

Network link 520 typically provides data communication through one or more networks to other data devices. For example, network link 520 may provide a connection through local network 522 to a host computer 524 or to data equipment operated by an Internet Service Provider (ISP) 526. ISP 526 in turn provides data communication services through the world wide packet data communication network now commonly referred to as the "Internet" 528. Local network 522 and Internet 528 both use electrical, electromagnetic or optical signals that carry digital data streams. The signals through the various networks and the signals on network link 520 and through communication interface 518, which carry the digital data to and from computer system 500, are exemplary forms of carrier waves transporting the information.

Computer system 500 can send messages and receive data, including program code, through the network(s), network link 520 and communication interface 518. In the Internet example, a server 530 might transmit a requested code for an application program through Internet 528, ISP 526, local network 522 and communication interface 518.

The received code may be executed by processor 504 as it is received, and/or stored in storage device 510, or other non-volatile storage for later execution. In this manner, computer system 500 may obtain application code in the form of a carrier wave.

In the foregoing specification, embodiments of the invention have been described with reference to numerous specific details that may vary from implementation to implementation. For example, embodiments of the invention have been described using bytes represented by an octet of bit positions. However, the present invention is not limited to bytes having any particular number of bit positions. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A method for compressing bitmaps of an index of a database table,
    generating a plurality of atoms that together represent a series of bitmaps, wherein each bitmap of said series of bitmaps contains a series of bytes, with bit positions that each corresponds to a record stored in a data block of a database and that indicates whether the record satisfies a particular criteria;
    wherein the series of bitmaps includes one bitmap that includes a different number of bytes than another bitmap in the series of bitmaps;
    wherein the series of bitmaps includes a plurality of gaps of one or more bytes, each of the one or more bytes having no bit positions set; and
    wherein each atom of said plurality of atoms that describes a gap of said plurality of gaps includes a gap code comprising: a block-skip code representing a number of bitmaps to skip, and
    a slot-skip code representing a number of bytes to skip within a bitmap.

2. The method of claim 1, wherein:
    each atom of said plurality of atoms includes a particular byte with a field of bit positions that represents both the block-skip code and the slot-skip code;
    a first set of bit positions of the field have been allocated to represent the block-skip code; and
    a second set of bit positions of the field have been allocated to represent the slot-skip code.

3. The method of claim 2, wherein the steps further comprise:
    encoding a first atom of said plurality of atoms;
    making a determination of how one or more bit allocation criteria are satisfied based on said encoding; and
    changing the allocation of the field between the block-skip code and slot-skip code based on said determination.

4. The method of claim 2, wherein:
    each atom of said plurality of atoms includes a first byte, said first byte including the field; and
    the field indicates whether the atom contains one or more other bytes that hold a block-skip code or a slot-skip code.

5. The method of claim 4, wherein the steps further include:
    encoding a first atom of said plurality of atoms;
    making a determination of how one or more bit allocation criteria are satisfied based on said encoding; and changing the allocation of the field between the block-skip code and slot-skip code based on said determination.

6. The method of claim 2, wherein:
each atom of said plurality of atoms includes a first byte, said first byte indicating an atom type;
a first atom of said plurality of atoms includes a second byte in addition to said first byte; and
the second byte includes the field.

7. The method of claim 6, wherein the steps further include:
encoding a first atom of said plurality of atoms;
making a determination of how one or more bit allocation criteria are satisfied based on said encoding; and
changing the allocation of the field between the block-skip code and slot-skip code based on said determination.

8. The method of claim 1, wherein the series of bitmaps includes at least one bitmap that has a different number of bytes than another bitmaps in the series of bitmaps.

9. The method of claim 1, wherein the series of bitmaps index a key value of said index.

10. The method of claim 1, wherein:
generating a plurality of atoms includes encoding a first atom of said plurality of atoms, said first atom containing only one byte;
said first atom contains a first gap code; and
decoding includes adding to the gap code the sum of:
(a) one, and
(b) the position number of the last byte, within the last block, represented by the atom previous to the first atom.

11. A computer-readable medium having stored thereon one or more sequences of instructions which, when executed by one or more processors, causes the one or more processors to perform the method recited in claim 1.

12. A computer-readable medium having stored thereon one or more sequences of instructions which, when executed by one or more processors, causes the one or more processors to perform the method recited in claim 2.

13. A computer-readable medium having stored thereon one or more sequences of instructions which, when executed by one or more processors, causes the one or more processors to perform the method recited in claim 3.

14. A computer-readable medium having stored thereon one or more sequences of instructions which, when executed by one or more processors, causes the one or more processors to perform the method recited in claim 4.

15. A computer-readable medium having stored thereon one or more sequences of instructions which, when executed by one or more processors, causes the one or more processors to perform the method recited in claim 5.

16. A computer-readable medium having stored thereon one or more sequences of instructions which, when executed by one or more processors, causes the one or more processors to perform the method recited in claim 6.

17. A computer-readable medium having store thereon one or more sequences of instructions which, when executed by one or more processors, causes the one or more processors to perform the method recited in claim 7.

18. A computer-readable medium having stored thereon one or more sequences of instructions which, when executed by one or more processors, causes the one or more processors to perform the method recited in claim 8.

19. A computer-readable medium having stored thereon one or more sequences of instructions which, when executed by one or more processors, causes the one or more processors to perform the method recited in claim 9.

20. A computer-readable medium having stored thereon one or more sequences of instructions which, when executed by one or more processors, causes the one or more processors to perform the method recited in claim 10.

* * * * *

UNITED STATES PATENT AND TRADEMARK OFFICE
CERTIFICATE OF CORRECTION

PATENT NO. : 7,467,150 B2 Page 1 of 1
APPLICATION NO. : 11/259456
DATED : December 16, 2008
INVENTOR(S) : Wang It is certified that error appears in the above-identified patent and that said Letters Patent is hereby corrected as shown below:

On the face page, in field (73), in column 1, in "Assignee", line 1, delete "Corproation" and insert -- Corporation --, therefor.

In column 4, line 45, before "gap sizes" delete "gap-sizes" and insert -- gaps --, therefor.

In column 14, line 19, in claim 17, delete "store" and insert -- stored --, therefor.

Signed and Sealed this

Twentieth Day of April, 2010

David J. Kappos
*Director of the United States Patent and Trademark Office*